United States Patent [19]
Yun

[11] Patent Number: 5,769,159
[45] Date of Patent: Jun. 23, 1998

[54] APPARATUS FOR OPENING/CLOSING A RADIATING SECTION BY USING A SHAPE MEMORY ALLOY

[75] Inventor: Hee-Do Yun, Seoul, Rep. of Korea

[73] Assignee: Daewoo Electronics Co., Ltd, Seoul, Rep. of Korea

[21] Appl. No.: 579,019

[22] Filed: Dec. 27, 1995

[30] Foreign Application Priority Data

Apr. 19, 1995 [KR] Rep. of Korea .......................... 94-9211
Apr. 19, 1995 [KR] Rep. of Korea .......................... 94-9212

[51] Int. Cl.[6] .................................................. F28F 27/00
[52] U.S. Cl. .......................... 165/276; 165/80.3; 454/184; 236/49.5; 361/694; 361/692
[58] Field of Search ................................. 165/80.3, 276; 454/184; 236/49.3, 49.5; 62/383; 361/687, 692, 693, 690, 694, 695

[56] References Cited

U.S. PATENT DOCUMENTS

| 2,902,262 | 9/1959 | Morse | 236/49.5 |
| 3,504,736 | 4/1970 | Tausch | 165/48.1 |
| 3,645,108 | 2/1972 | Houk | 236/49.5 |
| 4,147,299 | 4/1979 | Freeman | 361/695 |
| 4,495,545 | 1/1985 | Dufresne et al. | 361/692 |
| 5,528,455 | 6/1996 | Miles | 361/695 |

FOREIGN PATENT DOCUMENTS

| 0010556 | 1/1987 | Japan | 236/49.5 |
| 1-253300 | 10/1989 | Japan | 361/694 |
| 3-126294 | 5/1991 | Japan | 361/690 |
| 3-177096 | 8/1991 | Japan | 361/695 |
| 1684958 | 10/1991 | U.S.S.R. | 361/694 |

Primary Examiner—John K. Ford
Attorney, Agent, or Firm—Beveridge, DeGrandi, Weilacher & Young LLP

[57] ABSTRACT

A radiating section opening/closing apparatus in an apparatus including a housing having a radiating section while enclosing a heat generating section has at least one heat transmitting section fixed onto the heat generating section for transmitting the heat generated from the heat generating section, at least one expansion section for receiving the heat from the heat transmitting section and expanding/contracting at a specific temperature, at least one radiating section opening/closing section displaced by the expansion/contraction of the expansion section for opening/closing the radiating section, and at least one elastic member contracting/expanding while the expansion section expands/contracts for restoring the radiating section opening/closing section to an original position thereof. Thus, intrusion of foreign matters to the interior of the apparatus is blocked while externally discharging the heated air within the apparatus.

7 Claims, 7 Drawing Sheets

APPARATUS FOR OPENING/CLOSING A RADIATING SECTION BY USING A SHAPE MEMORY ALLOY

BACKGROUND OF THE INVENTION

1. Field of the Invention

The present invention relates to a radiating apparatus, and more particularly to an apparatus for opening/closing a radiating section by using a shape memory alloy.

2. Description of the Prior Art

Generally, an audio set includes an audio amplifier which amplifies externally received signals and provides the amplified signals. The amplifier includes an amplifying circuit which has a power supply apparatus and other packed active and passive devices. The amplifying circuit is mounted within a case. The power supply apparatus and other devices are connected to one another, and the connected devices consume electric energy to radiate heat, respectively. Therefore, air within the case is heated to raise a temperature within the case. The raise of the temperature within the case causes a malfunction of the devices. Accordingly, a radiating section for connecting the interior and exterior of the case is provided to the case so as to externally discharge the heat within the case.

FIG. 1 is a perspective view showing a case 100 of a general amplifier 105. As shown in FIG. 1, a plurality of radiating sections 1 and 2 are formed in the lengthwise direction in the upper plane and both sides of case 100. The plurality of radiating sections 1 and 2 are openings for externally discharging heated air within case 100. However, foreign matters such as dust are probably introduced into case 100 via the plurality of radiating sections 1 and 2. The introduced foreign matters are liable to result in the malfunction of amplifier 105. Meanwhile, a multiblade fan is installed within case 100 to force the heated air within case 10 to externally discharge. But, a noise apt to occur during the operation of the multiblade fan may cause an trouble to a user of the audio set.

SUMMARY OF THE INVENTION

Accordingly, it is an object of the present invention to provide an apparatus for opening/closing a radiating section by using a shape memory alloy.

To achieve the above object of the present invention, an audio amplifier includes an amplifying circuit having a heat generating section such as a power supply apparatus and a case enclosing the amplifying circuit, in which a radiating section opening/closing apparatus is mounted on the amplifying circuit. The case includes a radiating section. The radiating section opening/closing apparatus has a heat transmitting section formed of a substance such as a metal capable of transmitting the heat. The heat transmitting section is mounted on the heat generating section. A projection is installed to an inner upper portion of the case of the amplifier. Also, a radiating section opening/closing apparatus includes a swing part of which center is rotatably connected to the projection. An expansion section expandable/contractible at a temperature is installed between the heat transmitting section and swing part. In more detail, one end of the expansion section is fixed onto the heat transmitting section and the other end is fixed to one side of the swing part. Additionally, an elastic member is installed between the heat transmitting section and swing part in parallel with the expansion section. Here, one end of the elastic member is fixed onto the heat transmitting section and the other end is fixed to one side of the swing part. The other end of the swing part is in contact with the radiating section. While the expansion section expands/contracts, the swing part is rotated in the direction toward or away from the radiating section. By this rotative operation, the swing part opens/closes the radiating section. Therefore, the intrusion of foreign matters to the interior of the audio amplifier can be blocked, and the heated air within the amplifier can be externally discharged.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Hereinafter, a radiating section opening/closing apparatus by using a shape memory alloy according to the present invention will be described with reference to the accompanying drawings.

First Embodiment

Figure 1:
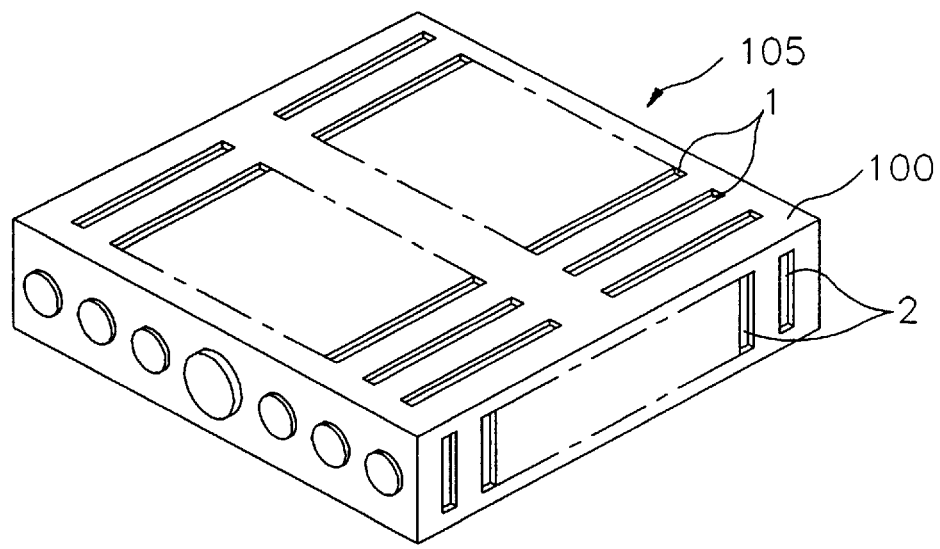
FIG. 1 is a perspective view showing a case of a general audio amplifier.
Figure 2:
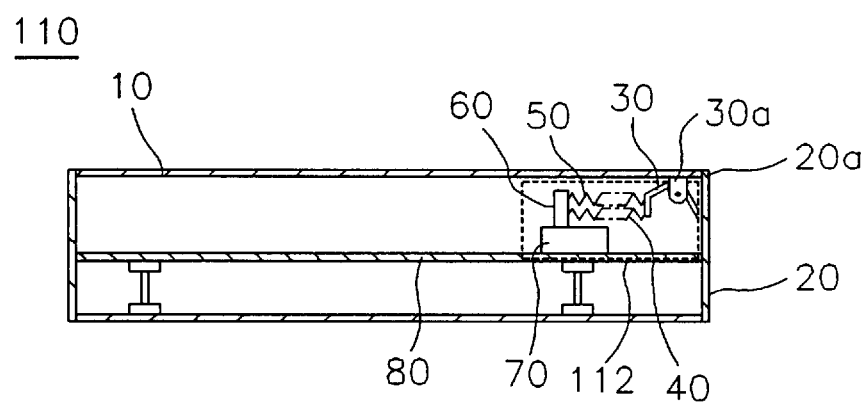
FIG. 2 is a sectional view showing a radiating section opening/closing apparatus according to a first embodiment of the present invention.
Figure 4:
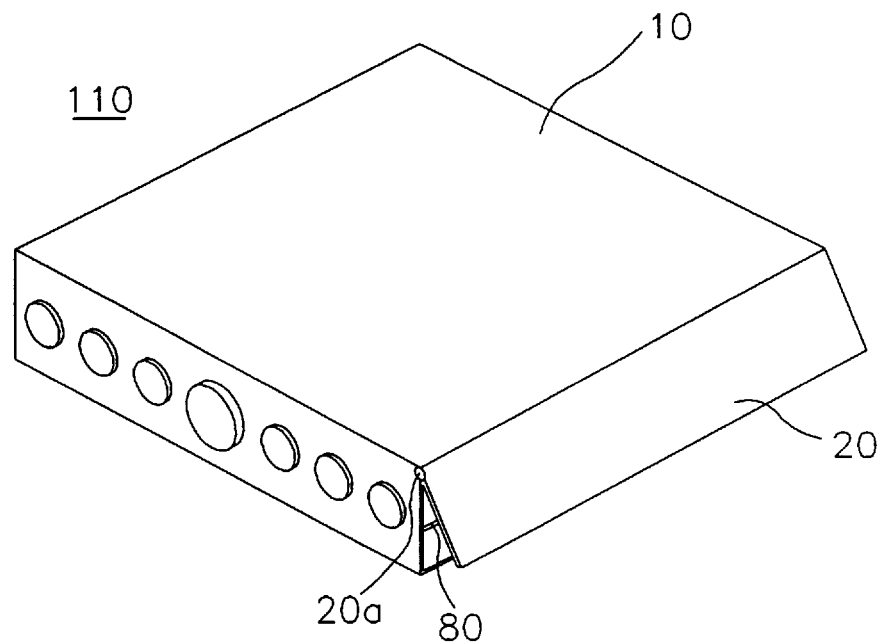
FIG. 4 is a view for illustrating a state that the radiating section is open by the operation of the radiating section opening/closing apparatus as shown in FIG. 2.

FIG. 2 is a sectional view showing a radiating section opening/closing apparatus according to a first embodiment of the present invention, and FIG. 4 is a view for illustrating a state that the radiating section is open by the operation of the radiating section opening/closing apparatus as shown in FIG. 2. As shown in FIG. 4, an audio amplifier 110 according to the first embodiment of the present invention includes a case 10 which is shaped as a box. A plurality of buttons or knobs are installed to a front plane 11 of case 10 for determining the function of audio amplifier 110. Case 10 is provided with a radiating section 20. One side of case 10 is utilized as radiating section 20. As shown in FIG. 2, one edge of radiating section 20 is rotatably coupled to one edge of case 10 by means of a hinge 20a. Audio amplifier 110 includes an amplifying circuit which has a heat generating section 70 such as a power supply apparatus and other active and passive devices in a dense manner. The amplifying circuit is provided on a circuit board 80.

Circuit board 80 is mounted within case 10. A radiating section opening/closing section 112 according to the first embodiment of the present invention includes a heat transmitter 60 formed of a substance such as a metal enabling heat transmission. Heat transmitter 60 is mounted on heat generating section 70. A projection 30a is formed on an inner upper portion of case 10. In addition, radiating section opening/closing section 112 has a swing part 30. The center of swing part 30 is rotatably joined with projection 30a. An expansion section 50 which can expand or contract in accordance with a temperature is provided between heat transmitter 60 and swing part 30. Here, a shape memory alloy which memorizes an original shape at a specific temperature is utilized as expansion section 50. More specifically, one end of expansion section 50 is fixed to heat transmitter 60 and the other end thereof is fixed to one side of swing part 30. Besides, an elastic member 40 is installed between heat transmitter 60 and swing part 30 in parallel with expansion section 50. Here, a spring is employed as elastic member 40. Thus, one end of elastic member 40 is fixed to heat transmitter 60 and the other end is fixed to one side of swing part 30. The other end of swing part 30 is in contact with radiating section 20.

Now, operations of radiating section opening/closing section 112 will be described as below.

Figure 5A:
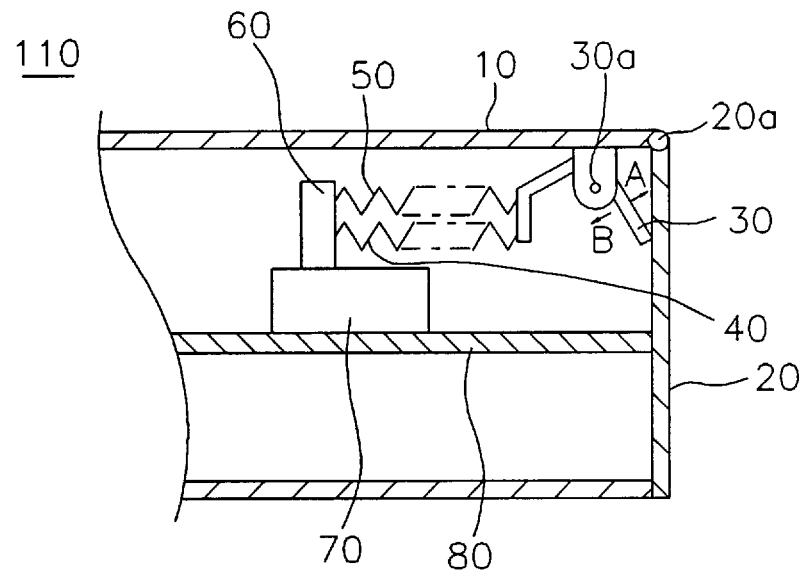
FIG. 5 shows views for illustrating the operation of the radiating section opening/closing apparatus as shown in FIG. 2.
Figure 5B:
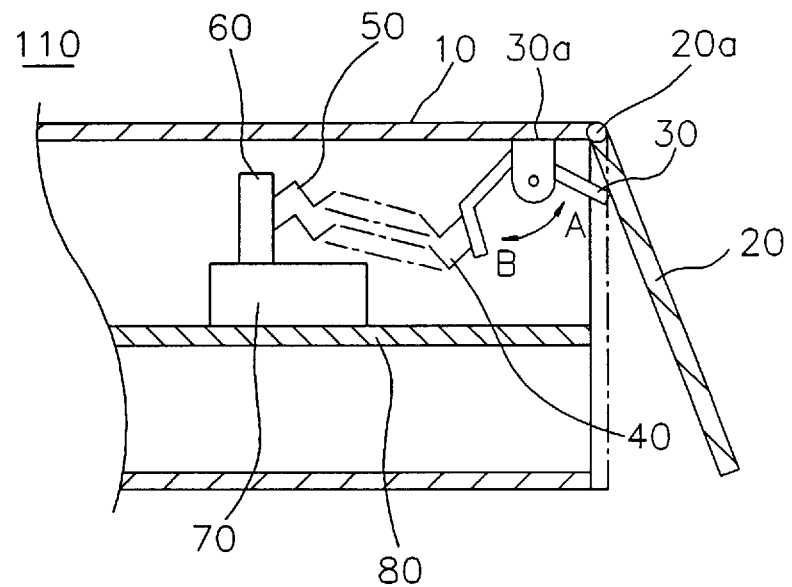

FIG. 5 includes views for illustrating the operation of the radiating section opening/closing section as shown in FIG. 2. FIG. 5A is a view showing a closed state of radiating section 20 and FIG. 5B is a view showing an open state of radiating section 20. As illustrated in (A) of FIG. 5, heat generating section 70 such as the power supply apparatus is not heated when audio amplifier 110 is not operated. Therefore, the heat is not transmitted to expansion section 50 from heat generating section 70. At this time, by means of a restoring force of elastic member 40, expansion section 50 is restored toward the inside of case 10. The restoring force of elastic member 40 causes swing part 30 to rotate in a clockwise direction (in the direction B). By this operation, radiating section 20 maintains the closed state. When audio amplifier 110 is operated, heat generating section 70 is heated. Accordingly, the heat is transmitted from heat generating section 70 to expansion section 50 via heat transmitter 60. Once a temperature of expansion section 50 reaches a specific temperature in accordance with the above-described heat transmission operation, expansion section 50 expands in conformity with a shape internally memorized therein. At this time, elastic member 40 is forcibly extended by the stretch of expansion section 50. As illustrated in (B) of FIG. 5, the stretch of expansion section 50 causes swing part 30 to rotate in a counterclockwise direction(in the direction A), thereby opening radiating section 20.

Second Embodiment

Figure 3:
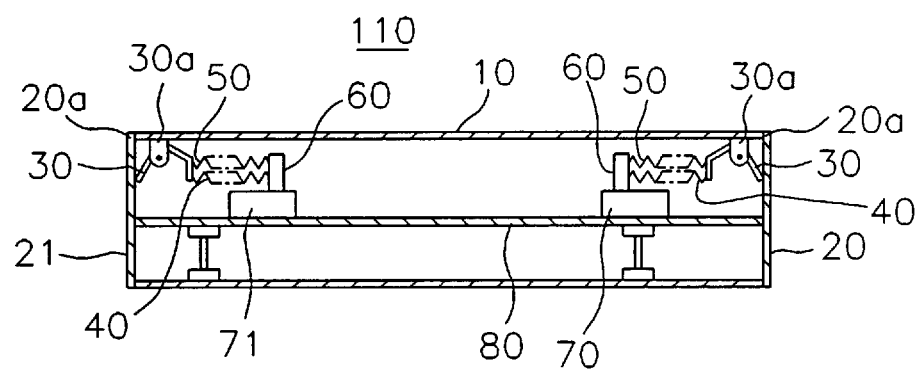
FIG. 3 is a sectional view showing a radiating section opening/closing apparatus according to a second embodiment of the present invention.
Figure 6:
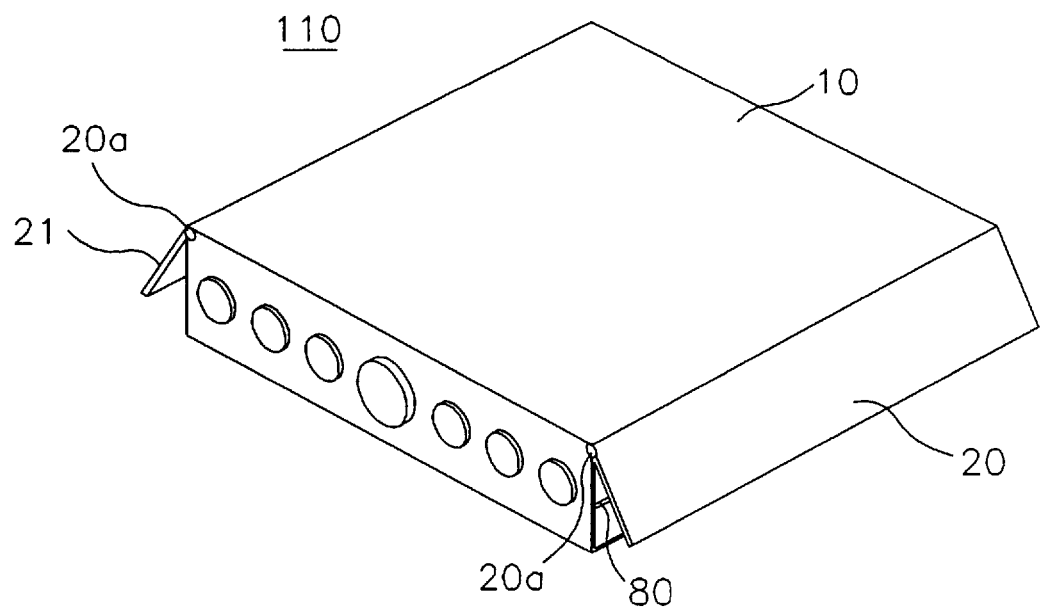
FIG. 6 is a view for illustrating a state that the radiating sections on both sides are open by the operation of the radiating section opening/closing apparatus as shown in FIG. 3.

FIG. 3 is a sectional view showing the radiating section opening/closing apparatus according to a second embodiment of the present invention. As shown in FIG. 3, two radiating section opening/closing apparatuses are installed in the second embodiment. The same reference numerals as in the first embodiment denote the same parts in the second embodiment. The radiating section opening/closing apparatuses are respectively constructed as that shown in the first embodiment of FIG. 2. A reference numeral 21 denotes the other radiating section installed in opposition to radiating section 20, and reference numeral 21 denotes the other heat generating section installed on circuit substrate 80. In the second embodiment, a detailed description with respect to the same parts as the first embodiment will be omitted. The operations of respective radiating section opening/closing apparatuses are identical to that of the radiating section opening/closing apparatus according to the first embodiment. In the second embodiment, both radiating sections 20 and 21 are opened/closed. FIG. 6 illustrates a state that the radiating sections on both sides are opened.

Third Embodiment

Figure 7:
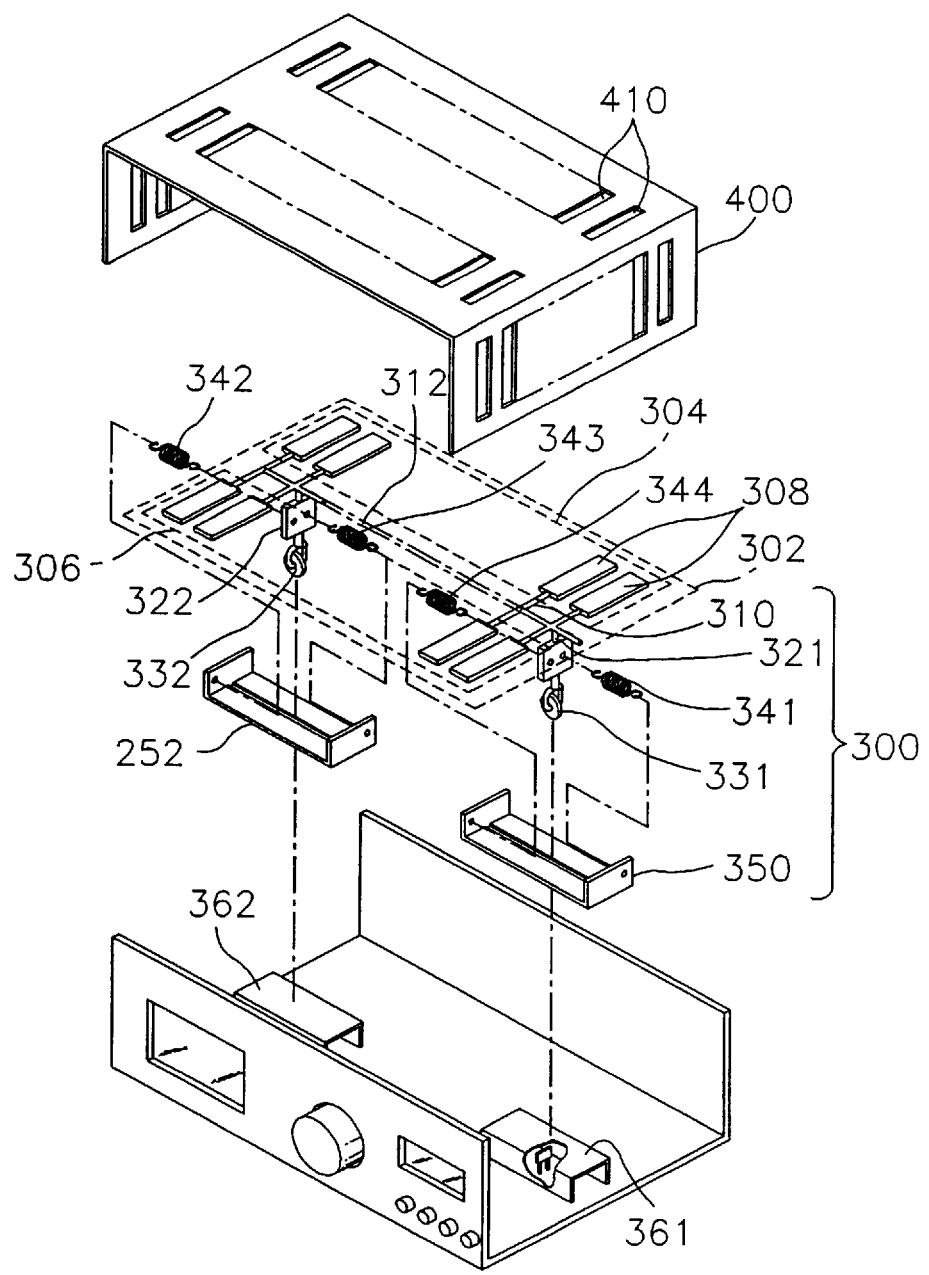
FIG. 7 is an exploded perspective view showing the radiating section opening/closing apparatus according to a third embodiment of the present invention.
Figure 8:
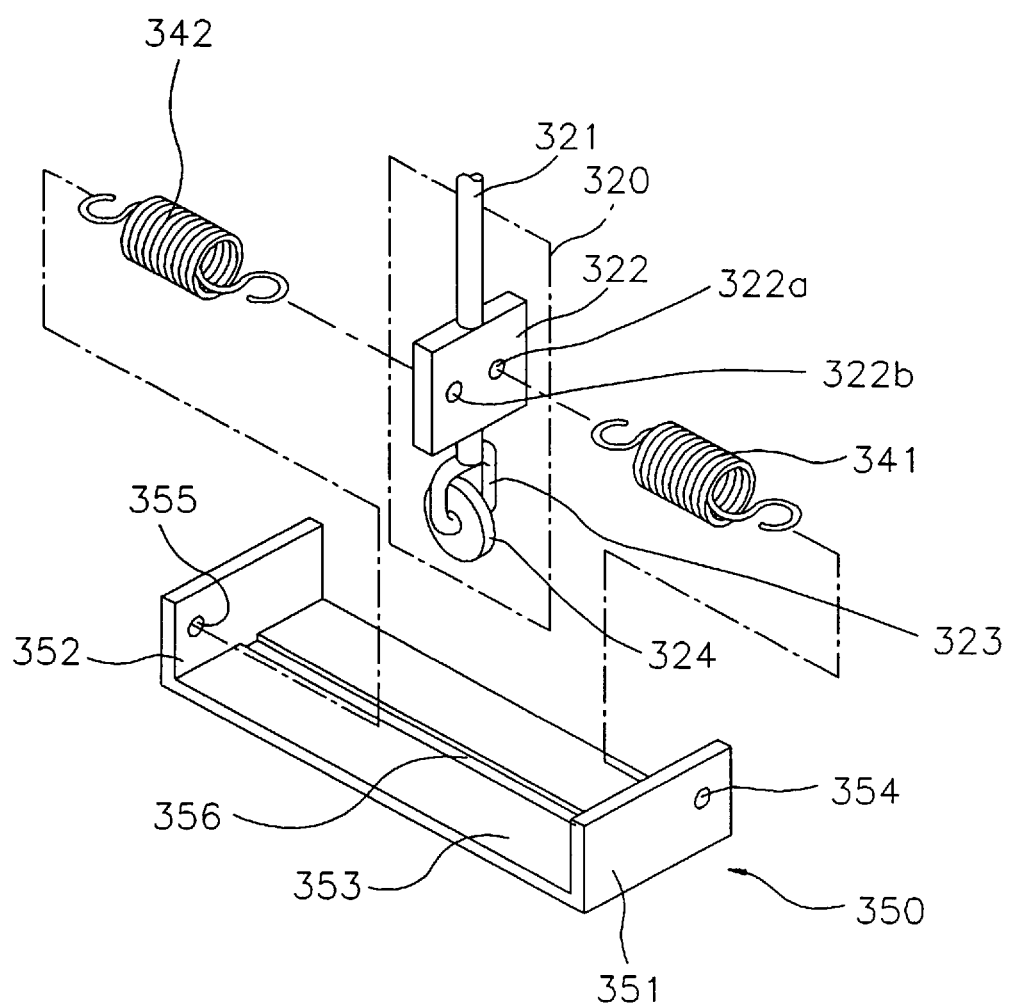
FIG. 8 is a view showing a portion of the radiating section opening/closing apparatus as shown in FIG. 7 in detail.

FIG. 7 is an exploded perspective view showing the radiating section opening/closing apparatus according to a third embodiment of the present invention. As shown in FIG. 7, a radiating section opening/closing apparatus 300 according to the third embodiment includes a radiating section opening/closing plate section 302 which has a first opening/closing plate arranging part 304 and a second opening/closing plate arranging part 306. First and second opening/closing plate arranging parts 304 and 306 are provided with a plurality of opening/closing plates, respectively. A reference numeral 308 denotes the respective opening/closing plates. The plurality of opening/closing plates are arranged in a row spaced by a prescribed distance from one another. The plurality of opening/closing plates of first opening/closing plate arranging part 304 are connected to the plurality of opening/closing plates of second opening/closing plate arranging part 306 via a plurality of connecting bars in a one-to-one basis. A reference numeral 310 denotes respective connecting bars. Respective centers of the plurality of connecting bars are joined to a single frame 312. FIG. 8 is a view showing a portion of the radiating section opening/closing apparatus as shown in FIG. 7 in detail. Referring to FIGS. 7 and 8, two moving parts are fixed to frame 312 separated from the center of frame 312 by a prescribed distance at opposing places to each other. A reference numeral 320 denotes one moving part. The other moving part has the same structure as moving part 320, of which description will thus be omitted.

Moving part 320 includes a supporting rod 321, a fixing plate 322, a rectangular ring 323 and a guide wheel 324. One end ot supporting rod 321 is fixed to one side of frame 312 and the other end thereof is fixed to the upper end of fixtng plate 322. First and second fitting holes 322a and 322b are formed in the center of fixing plate 322 in parallel with each other. Guide wheel 324 is rotatably inserted in rectangular ring 323.

The third embodiment of the present invention includes two fixing parts. A reference numeral 350 denotes one fixing part. The other fixing part has the same structure as fixing part 350, of which description will thus be omitted. Fixing part 350 has first and second walls 351 and 352 and a connection plate 353. First wall 351 is forced to one end of connection plate 353, and second wall 352 is formed to the other end of connection plate 353. First and second walls 351 and 352 have a first coupling hole 354 and a second coupling hole 355 respectively. Connection plate 353 has a guide groove 356 in the lengthwise direction in the center thereof, so that guide wheel 324 is fitted into guide groove 356.

Reference numerals 341 and 342 denote a coil spring and a shape memory alloy spring, respectively. One end of coil spring 341 is inserted to first fitting hole 322a and the other end thereof is inserted to first coupling hole 354. One end of shape memory alloy spring 342 is inserted to second fitting hole 322b and the other end thereof is inserted to second coupling hole 355.

Reference numerals 361 and 362 denote first and second radiating covers which enclose a heat generating section such as a power supply apparatus (not shown) of the amplifying circuit.

The bottom plane of fixing part 350 is fixed to the upper plane of first radiating cover 361.

As shown in FIG. 7, case 400 of the audio amplifier having radiating section opening/closing apparatus 300 has the plurality of radiating sections. A reference numeral 410 denotes each radiating section. The plurality of radiating sections are formed to correspond to the plurality of opening/closing plates of first opening/closing arranging section 304 and second opening/closing arranging section 306.

Hereinbelow, the third embodiment of the present invention will be described.

Figure 9:
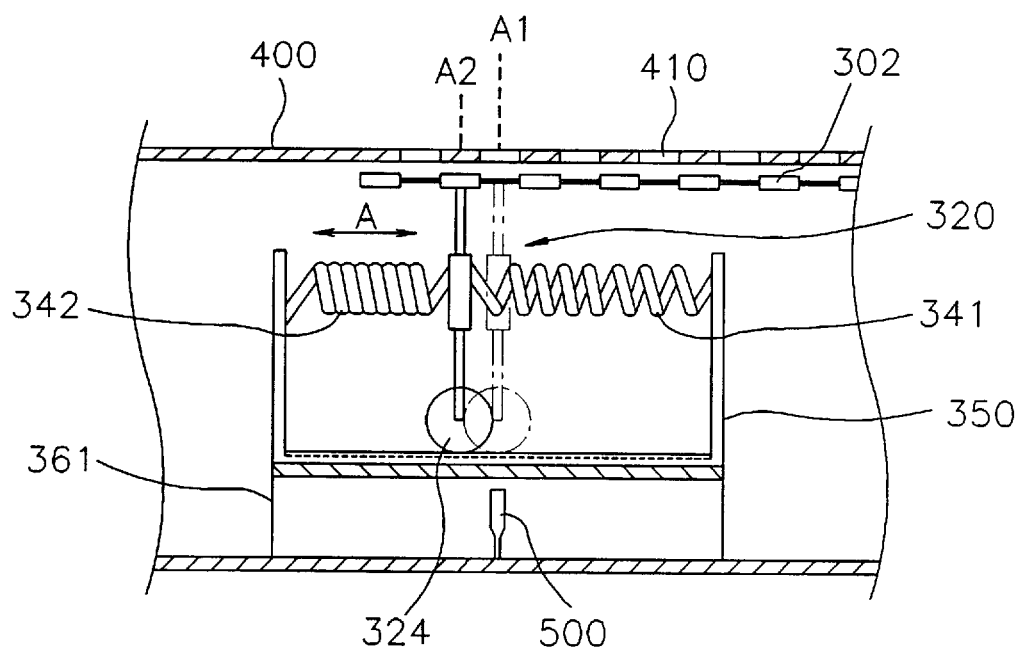
FIG. 9 is a view for illustrating the opening/closing operations executed by the radiating section opening/closing apparatus as shown in FIG. 7.

FIG. 9 is a view for illustrating the opening/closing operations executed by the radiating section opening/olosing apparatus as shown in FIG. 7. For corvenience, only one moving part 370 is illustrated. The description of the operations of moving part 320 is applied to the other moving part. Here, the operations with respect to radiating section opening/closing apparatus 300 installed on first radiating cover 361 will be described. A bi-directional arrow A indicates the moving direction of moving part 320.

To begin with, unless the power is supplied to the audio amplifier, heat generating section (schematically illustrated as designated by a reference numeral 500) such as the power supply apparatus does not generate the heat. Therefore, the heat is not transmitted to shape memory alloy spring 342, so that moving part 320 of radiating section opening/closing apparatus 300 is placed on a position A1 by coil spring 341. As shown in FIG. 9, when moving part 320 is placed on position A1, the plurality of radiating sections are closed by the plurality of opening/closing plates respectively corresponding to the radiating sections. Reference numerals 410 and 320 denote individual radiating section and opening/closing plate, respectively.

When the power is supplied to the audio amplifier, heat generating section 500 such as the power supply apparatus discharges heat. The discharged heat sequentially heats first radiating cover 361 and fixing part 350. While fixing part 350 is heated, shape memory alloy spring 342 is also heated, so that a temperature thereof is heightened. Once the temperature of shape memory alloy spring 342 reaches a specific temperaLure, shape memory alloy spring 342 contracts to have a memorized shape. The contraction of shape memory alloy spring 342 moves moving part 320 leftward. At this time, coil spring 341 expands leftward. At this tine, moving part 320 is placed on a position A2. As shown in FIG. 9, the plurality of radiating sections are opened by the movement of the plurality of openinq/closing plates corresponding to the radiating sections while moving part 320 is placed on position A2.

Once again, if the power supply to the audio amplifier is cut off, the temperature of shape memory alloy spring 342 is lowered. When the temperature of shape memory alloy spring 342 drops down from a specific temperature, shape memory alloy spring 342 loses its memorized shape. At this time, moving part 320 is moved rightward by a restoring force of coil spring 341. When coil spring 341 loses the restoring force, moving part 320 is placed on position A1. Thus, the plurality of radiating sections are closed by the plurality of open/close plates.

On the other hand, the moving direction of the other moving part is the same as moving part 320. Since the operations of the other moving part are the same as moving part 320, tile description of the operations of the other moving part will be omitted.

As a result, the radiating section opening/closing apparatus according to the present invention prevents the intrusiun of foreign matters inside of the audio amplifier, and externally discharge the heated air within the amplifier.

While the present invention has been particularly shown end described with reference to particular embodiments thereof, it will be understood by those skilled in the art that various changes in form and details may be effected therein without departing from the spirit and scope ot the invention as defined by the appended claims.

What is claimed is:

1. In an apparatus including a housing having a radiating section while enclosing a heat generating section, a radiating section opening/closing apparatus comprising:

at least one heat transmitting section fixed onto said heat generating section and for transmitting heat generated from said heat generating section, including first and second walls and a connection plate, the first wall being formed to one end of the connection plate and the second wall being formed to the other end of the connection plate, and the connection plate being mounted on said heat generating section, wherein the connection plate has a guide groove in the lengthwise direction in the center thereof;

at least one expansion section for receiving said heat from said heat transmitting section and expanding/contracting at a specific temperature;

at least one radiating section opening/closing section displaced by the expansion/contraction of said expansion section for opening/closing said radiating section; and at least one elastic member contracting/expanding while said expansion section expands/contracts for restoring said radiating section opening/closing section to an original position thereof; and at least one moving section including a supporting rod, a fixing plate, a rectangular ring, and a guide wheel, and for moving said at least one radiating section opening/closing section to open/close said radiating section according to the contracting/expanding of said at least one elastic member and said at least one expansion section, one end of the supporting rod being fixed to said at least one radiating section opening/closing section, and the other end of the supporting rod being fixed to the upper end of the fixing plate, the lower end of the fixing plate being fixed to the upper end of the rectangular ring, and the center portion of the guide wheel being rotatably inserted into the lower end of the rectangular ring, wherein the guide wheel is rotatably fitted into the guide groove of the connection plate of said at least one heat transmitting section.

2. A radiating section opening/closing apparatus as claimed in claim 1, wherein said expansion section is a shape memory alloy.

3. A radiating section opening/closing apparatus as claimed in claim 1, wherein said elastic member is a spring.

4. A radiating section opening/closing apparatus as claimed in claim 1, wherein said expansion section is shaped in a coil spring.

5. A radiating section opening/closing apparatus as claimed in claim 1, wherein said radiating section is a plurality of openings which are formed in the upper plane of said housing in a row spaced at a certain distance from one another.

6. A radiating opening/closing apparatus as claimed in claim 5, wherein said radiating section opening/closing section includes a plurality of opening/closing plates corresponding to said plurality of openings in a one-to-one basis.

7. A radiating opening/closing apparatus as claimed in claim 1, wherein said at least one expansion section is mounted between the fixing plate and one of the first and second walls, said at least one elastic member is mounted between the fixing plate and the other wall, so that said at least one expansion section and said at least one elastic member react to each other in expansion and contraction.

* * * * *